United States Patent

[11] 3,569,863

[72] Inventors Michael C. J. Cowpland
Ottawa, Ontario;
Harry J. Lajeunesse, Stittsville, Ontario, Canada

[21] Appl. No. 783,626
[22] Filed Dec. 13, 1968
[45] Patented Mar. 9, 1971
[73] Assignee Northern Electric Company Limited
Montreal, Quebec, Canada

[54] TWIN-T OSCILLATOR
7 Claims, 2 Drawing Figs.

[52] U.S. Cl. .......... 331/110, 331/142, 333/75
[51] Int. Cl. .......... H03b 5/26
[50] Field of Search .......... 333/175; 331/110, 142; 330/38

[56] References Cited
UNITED STATES PATENTS

| | | | |
|---|---|---|---|
| 2,927,282 | 3/1960 | Gardberg .......... | 331/110 |
| 3,457,526 | 7/1969 | Orr .......... | 331/142 |

OTHER REFERENCES

L. Mourlam, Jr. " Feedback Loop Stabilizes FET Oscillator," Electronics, Pg 97, Sept. 4, 1967 331— 110

*Primary Examiner*—John Kominski
*Attorney*—Curphey and Erickson

ABSTRACT: A twin-T oscillator utilizing positive feedback in which the attenuation through the twin-T feedback network is reduced by unbalancing the components so as to provide a low impedance input side and a high impedance output side, thereby reducing the overgain requirements of the associated amplifier.

Figure 1:
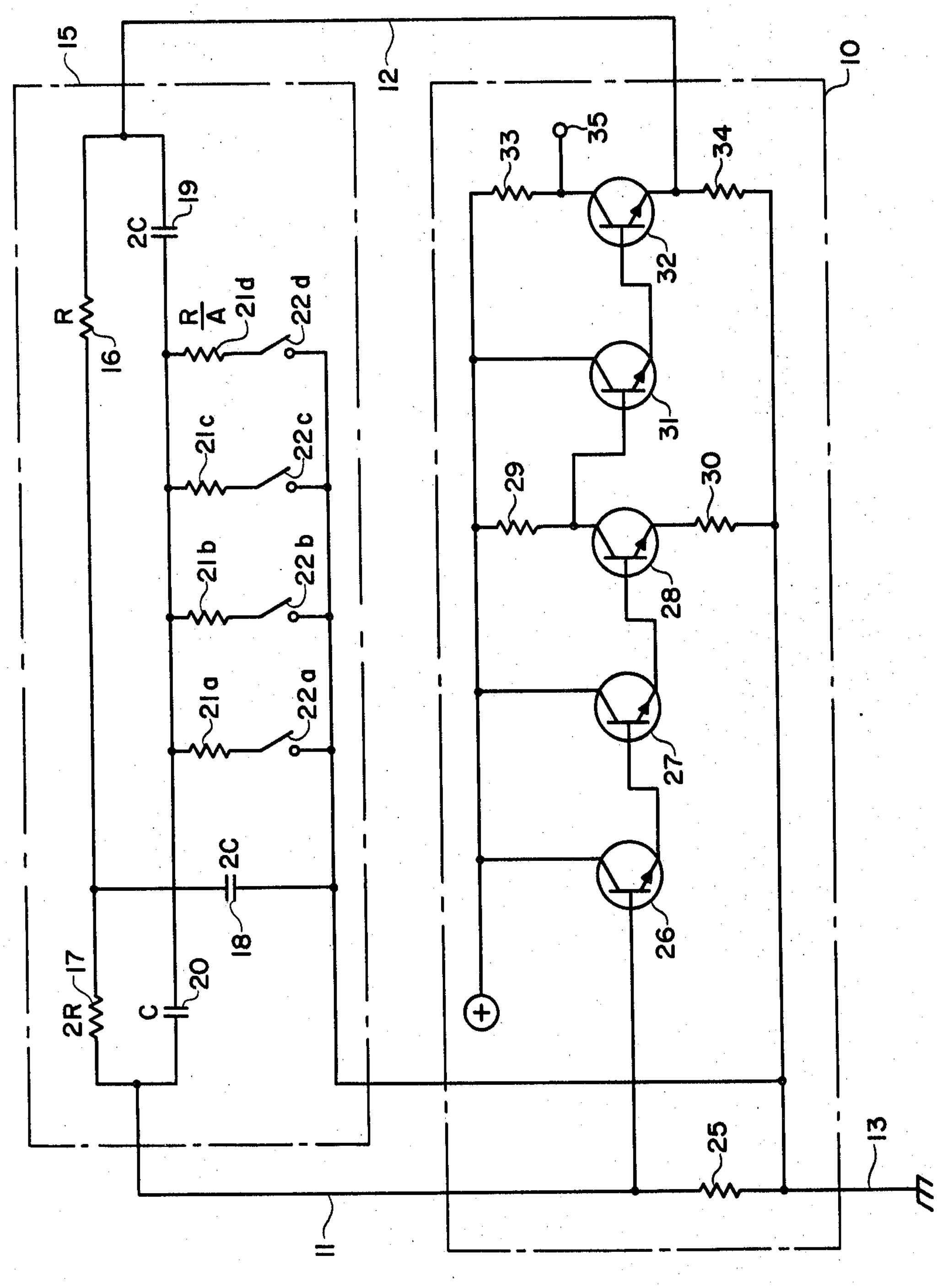

INVENTORS
MICHAEL C. J. COWPLAND
HARRY J. LAJEUNESSE
BY Curphey & Erickson
PATENT AGENTS Patented March 9, 1971 3,569,863

2 Sheets-Sheet 2

INVENTORS
MICHAEL C. J. COWPLAND
HARRY J. LAJEUNESSE
BY Curphey & Erickson
PATENT AGENTS

TWIN-T OSCILLATOR

This invention relates to an improved twin-T oscillator and more particularly to one in which the attenuation through the twin-T feedback network is reduced.

The twin-T oscillator has been used in the past to provide stable oscillations with a resistive-capacitive (R-C) twin-T feedback network. This form of oscillator is particularly adaptable to integrated circuit applications since no inductances are required in the frequency selective components.

Previously, the general approach has been to select the values of the components in the twin-T feedback network to provide a rapid change of phase with frequency at 180° phase shift. The network is connected across an amplifier which has an additional 180° phase shift thus generating positive feedback around the loop. With sufficient gain in the amplifier, the combination oscillates with good frequency stability. However, the attenuation through the network is at a maximum at 180° phase shift and varies directly as the change of phase with frequency. As a result, prior oscillators of this type have had to use high-gain amplifiers (i.e., 40 db. or greater) to overcome this high attenuation thus subjecting the oscillator to parasitic oscillations. The construction of such an oscillator utilizing a high-gain amplifier is described in "Twin-T Oscillators" by Fred Maynard, May 1963 Electronics World, p. 40 .

The problem of parasitic oscillations is aggravated in printed circuit applications because the components are so densely packed. A discussion on this is presented in "A Tone-Generating Integrated Circuit" by R.W. Berry et al. 1966 Bell Laboratories Record, p. 319 . Here the problem has been overcome by utilizing additional thin-film capacitors to suppress the parasitic oscillations and by spatial isolation, thus adding to the complexity and size of the unit.

In certain applications, it is desirable to vary the frequency of the oscillator, preferably by adjusting or changing only one of the resistive components of the feedback network. This has been done in the past by varying either one of the resistances in the T-arm (e.g., U.S. Pat. No. 3,072,868 to E.R. Lucka et al. issued Jan. 8, 1963) or the shunt arm (e.g., F. Maynard, supra). As the resistances vary, the attenuation through the feedback network changes with frequency. Thus, with a constant gain amplifier, the output level of the oscillator will also vary with frequency.

It has previously been discovered that as the resistance is varied, the attenuation through the network first decreases from a maximum to a minimum, and thereafter increases with a relatively large plateau in the area of minimum attenuation. If the components are selected to operate in this latter area, the output and distortion from the oscillator remain substantially constant over a range of frequencies. One configuration which provides this plateau area is formed by making the resistance in the shunt arm variable and by making the values of the resistances in each of the series T-arms at least several times the maximum value of the resistance in the shunt arm.

If the oscillator is to operate at discrete frequencies, this can be done by preselecting the values of all the components in the frequency determining network and thereafter switching in the particular resistor which will cause oscillations at the desired frequency. This system is often used in integrated circuit applications such as described in the above-mentioned article by Berry et al.

As stated in this article, in integrated circuit applications it is extremely difficult to etch the frequency selective components to a close tolerance so that the desired frequency can be obtained initially. As a result, it a common practice to design the filter network so that the resistors are below the desired value and to thereafter anodize or trim the resistors until the desired frequency from the oscillator is obtained. When this approach was applied to twin-T oscillators, utilizing feedback networks having high attenuation, anodization of only one of the resistances altered the frequency to the desired point but did not compensate for variations in the overall attenuation at the plateau level due to the tolerances of the other components in the network. As a result, if the attenuation through the network were too high, the circuit would fail to oscillate or if it were too low, the output signal would be heavily distorted. This could be overcome by increasing the gain of the amplifier so that the circuit will oscillate under all conditions. However, this leads to heavy distortion of the output signal under certain operating conditions. If low distortion of the output signal is a requirement, the problem can be overcome by making the gain of the amplifier adjustable, but at additional complexity and cost. Also such requirements do not lend themselves to integrated circuit design. Thus, it was found necessary to alter the values of several resistors in a complex fashion in order to adjust the oscillator to its correct frequency, while maintaining the desired attenuation through the filter network. In addition, since such a filter network is of relatively high selectivity, any change in the value of the components with temperature or other ambient conditions caused a marked change in the output frequency of the oscillator.

A second approach which can be taken is to utilize a relatively low selectivity feedback network. At first view, it would be assumed that this would reduce the stability of the oscillator since the phase shift of the frequency determining components is not nearly as rapid in the vicinity of the oscillator frequency. However, this is not necessarily the case. With the twin-T oscillator, a reduction in selectivity of the feedback network results in a reduction in the attenuation through it. As a direct result, a significant reduction in the amplifier gain can be made while maintaining oscillator stability. Because it is much easier to maintain stability in a low-gain amplifier than one of high gain, it has been found that no significant decrease in the frequency stability of the oscillator results. Additionally, with a low selectivity feedback network, the variations in attenuation at the plateau area are substantially reduced since in terms of percentage, the values of the components are not nearly as critical. Thus, the final frequency of the oscillator can be adjusted simply by anodizing a single resistive component, while a close tolerance on the attenuation at the plateau level is maintained.

As can be appreciated, with this approach it is desirable to achieve minimum attenuation through the filter in order that the gain of the associated amplifier can be reduced as much as possible.

It has been discovered that a significant reduction in the attenuation through the network can be achieved without reducing its selectivity by unbalancing the R-C components so as to provide a network having a high-impedance output and a low-impedance input, and by coupling the network to an amplifier having a relatively low output impedance and a high input impedance.

In accordance with the present invention there is provided a twin-T oscillator comprising a phase inversion amplifier having a high input impedance, and a twin-T feedback network for determining the frequency of the oscillator. The feedback network comprises a first T having series resistances and a shunt capacitance, and a second T having series capacitances and a shunt resistance. In order for the feedback network to function in the plateau area, the resistance of the series resistance is at least several times that of the shunt resistance. In addition, in order to reduce the attenuation through the filter, the value of the output resistance is at least one and a half times and preferably twice that of the input resistance in the series arm while the value of the input capacitance is at least one and a half times and preferably twice that of the output capacitance in the other series arm. The input impedance to the amplifier is made at least as great as the series resistance in the output side of the network, so that it will not excessively load the latter and increase the attenuation through it. As a result, an extremely stable oscillator in both output signal level and frequency is obtained.

In one embodiment of the invention the frequency of the oscillator is altered by varying the shunt resistance. This can be accomplished by selecting any one of a plurality of fixed resistances. By varying only the shunt resistance, the series resistances can readily form part of the DC bias path for the input transistor of the amplifier, thus performing two functions. As a result, changing the value of the shunt resistance to alter the frequency does not affect the bias voltage since the shunt resistance is DC isolated by the series capacitances.

Figure 2:
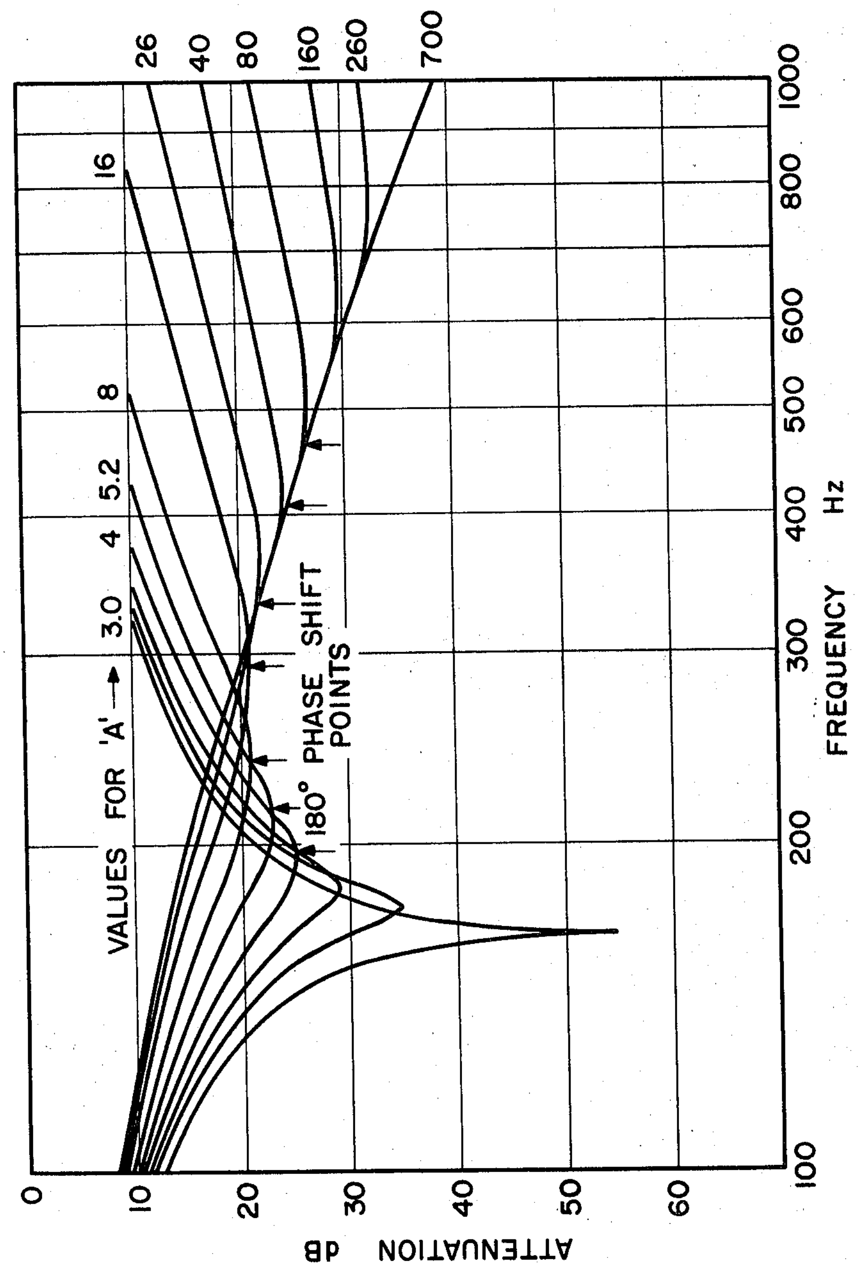

An example embodiment of the invention will now be described with reference to the accompanying drawings in which:

FIG. 1 is a schematic circuit diagram of a twin-T oscillator in accordance with the present invention; and FIG. 2 is a graph of attenuation versus frequency under various operating conditions of a feedback network which forms part of the oscillator shown in FIG. 1.

Referring to FIG. 1, the twin-T oscillator comprises an amplifier 10 having a high-impedance input connection 11, a low-impedance output connection 12 and a common connection 13. In addition, the oscillator comprises a twin-T feedback network 15 which comprises: fixed input and output resistors 16 and 17 connected in series between the output and input connections 12 and 11, respectively; a fixed shunt capacitor 18 connected between the junction of the two resistors 16 and 17 and the ground 13; fixed input and output capacitors 19 and 20 also connected in series between the output and input connections 12 and 11 respectively. In addition, a variable shunt resistor comprising any one of a plurality of resistors 21*a*, 22*b*, 22*c*, or 21*d*, can be connected between the junction of the two capacitors 19 and 20 and ground 13 through switches 22*a*, 22*b*, 22*c*, or 22*d*, respectively.

Across the input of the amplifier 10 is a high-impedance resistor 25, one end of which is connected to the input connection 11 and the other to ground 13. The input connection 11 is connected to a Darlington pair comprising transistors 26 and 27 so as to provide a high input impedance. The emitter output of the transistor 27 is connected to the base of an amplifying transistor 28 having a collector load resistor 29 and an emitter load resistor 30. The collector output of the transistor 28 (which provides 180° phase inversion therethrough) is connected to a modified Darlington pair comprising transistors 31 and 32. The transistor 32 has a collector load resistor 33 and an emitter load resistor 34. The emitter of the transistor 32 is connected to the output connection 12. The signal output from the oscillator is taken from the collector terminal 35.

The frequency of the oscillator is determined by the values of the components in the feedback network 15. In order that the attenuation through the feedback network 15 remain substantially constant over approximately a 35 percent frequency range, the values of the series resistors 16 and 17 are made at least four times as great as the maximum value of the frequency selective resistors 21*a*—*d* . A better understanding of this is obtained from FIG. 2 which illustrates the attenuation through the filter for various ratios of the resistors 16, 17 and 21*a*—*d* and capacitors 18, 19 and 20, where by way of example only the following were used:

R= the relative value of the series resistor 16,

2R= the relative value of the output resistor 17,

R/A = the relative value of the selected shunt resistor 21 *a*,*b*,*c*, or *d*,

A being a numeral

2C = the relative value of the capacitor 20, and

Resistor 16/Resistor 17 = Capacitor 20/Capacitor 19.

As can be seen from FIG. 2, by selecting values of A which are greater than 4, the notch frequency of the feedback network 15 (at which 180° phase shift occurs) can be varied over a relatively large range with very little change in the attenuation through it, thus forming a plateau area over which the oscillator frequency can be varied without appreciably affecting the output amplitude level. The attenuation at the plateau level itself can also be altered by varying the ratio of the series resistors 16 and 17 and the series capacitors 19 and 20.

By way of example only, the following values can be utilized to provide a network having a low attenuation therethrough with frequencies in the middle of the audio frequency range.

| | |
|---|---|
| Resistor 16 | 40 kΩ |
| Resistor 17 | 80 kΩ |
| Resistor 21*a* | 2 kΩ |
| Resistor 21*b* | 3 kΩ |
| Resistor 21*c* | 4 kΩ |
| Resistor 21*d* | 5 kΩ |
| Resistor 25 | 100 kΩ |
| Capacitor 18 | 0.01 μfd. |
| Capacitor 19 | 0.01 μfd. |
| Capacitor 20 | 0.005 μfd. |

In operation, closure of any one of the switches 22*a*—*d* connects the corresponding resistor 21*a*—*d* to ground resulting in an output from the network 15 which is 180° out of phase with that at the input.

Utilizing the values given above, the output signal is attenuated significantly less than 25 db., and is about 21.5 db. through the network 15. The signal is applied across the input resistor 25 of the amplifier 10. The amplifier 10 has a voltage gain of about 23 db. and a phase shift of 180°. Since the loop gain is greater than unity, oscillations will occur at the frequency in which the phase shift through the network 15 is 180°. By selecting values of A which are between about 8 and 20, the loss through the network 15 and hence the output signal level of the oscillator can be held within ±0.2 db.

The impedance of the resistor 25 across the input of the amplifier 10 is made high enough so that it does not appreciably load the network 15 but is low enough to effectively shunt the input impedance of the transistor 26 so that changes in its leakage current do not alter the operating conditions of the amplifier 10. In addition, the resistor 25 in conjunction with the two series resistors 16 and 17 set the operating bias of the input transistor 26. Since the shunt resistors 21 *a*—*d* are DC isolated by the capacitors 19 and 20, changing from one to the other does not affect the operating bias of the transistor 26.

The attenuation through the network 15 is substantially reduced by unbalancing the resistors 16 and 17 and the capacitors 19 and 20 without reducing its selectivity. Thus, the resistor 17 is made at least 1.5 times and preferably twice that of resistor 16 while the capacitor 19 is made at least 1.5 times preferably twice that of capacitor 20. This significant alteration in known twin-T oscillators permits the use of a low-gain amplifier 10 which provides a high degree of amplitude stability without sacrificing the frequency stability.

This is particularly significant in integrated circuit applications where, as stated previously, it is extremely difficult to form the components initially to an exact value. Thus, as in prior circuits which had a high attenuation through the network 15, the final frequencies of the oscillator can be achieved by adjusting only the resistors 21*a*—*d*. However, in the prior circuits, the overall attenuation of the plateau level would vary as much as several decibels, due to the tolerance in the resistors 16 and 17 and the capacitors 18, 19 and 20. As a result, with a fixed gain amplifier, the oscillator would either fail to oscillate or would provide a highly distorted output. One solution to this was to anodize all three of the resistors 16, 17 and 21*a*—*d* in a relatively complex fashion in order to achieve the required frequency and attenuation through the network 15. In the improved circuit of the present invention which has reduced attenuation through the network 15, the tolerance in the resistors 16 and 17 and the capacitors 18, 19, and 20 has relatively little effect on the overall attenuation. This is because the same percentage change in the values of the components represents a much smaller variation in decibels due to the much lower overall attenuation through the network. As a result, the final frequencies of the oscillator can be achieved with the desired attenuation through the network 15, by anodizing only the resistors 21*a*—*d*.

Utilizing the component values listed above, the network can be tuned over a 35 percent frequency range with an amplitude variation of only ±0.2 db. As a result, utilizing an amplifier having a fixed gain of 23 db. results in an oscillator with a distortion of less than 5 percent. Such an oscillator can be readily constructed utilizing integrated circuit techniques and turned by anodizing only the frequency variable resistors 21*a*—*d*.

We claim:

1. In a twin-T oscillator comprising:

a. a phase inversion amplifier having a high-impedance input connection, a low-impedance output connection and a common connection; and b. a twin-T feedback network for determining the frequency of said oscillator, said network for determining the frequency of said oscillator, said network comprising:

c. fixed input and output resistances connected in series between the output and input connections respectively;

d. a fixed shunt capacitance connected between the junction of the two resistances and the common connection;

e. fixed input and output capacitances connected in series between the output and input connections respectively; and f. a shunt resistance, connected between the junction of the two capacitances and the common connection, said resistances and capacitances coacting together to provide a phase inversion through the network at a predetermined frequency;

g. the improvement comprising:

h. the resistance of said output resistance being at least 1.5 times that of said input resistance;

i. the capacitance of said input capacitance being at least 1.5 times that of said output capacitance; and j. the resistance of said input resistance being at least four times that of said shunt resistance, whereby the network has reduced attenuation therethrough.

2. An oscillator as defined in claim 1 in which the shunt resistance is variable, whereby the oscillator can be turned over a range of frequencies with substantially no change in the attenuation through the network

3. An oscillator as defined in claim 2 in which:

a. the resistance of the output resistance is equal to twice that of the input resistance, and b. the capacitance of the input capacitance is equal to twice that of the output capacitance.

4. An oscillator as defined in claim 3 in which:

a. the capacitance of the input capacitance and the shunt capacitance are equal, and b. the resistance of the input resistance is between about eight and 20 times that of the variable shunt resistance.

5. An oscillator as defined in claim 1 which further comprises;

a. a further resistance across the input of the amplifier, and in which b. the amplifier utilizes direct current coupled transistors, and c. the input and output resistances are direct current coupled to the amplifier so as to set, in conjunction with the further resistance, the direct current bias for the input transistor of the amplifier.

6. An oscillator as defined in claim 1 in which the impedance between input connection and the common connection of the amplifier is at least as great as the resistance of said output resistance.

7. An oscillator as defined in claim 6 in which the attenuation through the twin-T feedback network is less than 25 decibels.